United States Patent
Behzad

(10) Patent No.: US 7,477,888 B2
(45) Date of Patent: Jan. 13, 2009

(54) LOW NOISE AND LOW VOLTAGE MIXER AND INTERMEDIATE FREQUENCY MODULE APPLICATION THEREOF

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 314 days.

(21) Appl. No.: 11/021,631

(22) Filed: Dec. 22, 2004

(65) Prior Publication Data

US 2005/0101280 A1 May 12, 2005

Related U.S. Application Data

(63) Continuation of application No. 10/041,148, filed on Jan. 7, 2002, now Pat. No. 6,865,382.

(51) Int. Cl.
H04B 1/26 (2006.01)
H03F 3/45 (2006.01)
(52) U.S. Cl. .............. 455/323; 455/232.1; 330/254
(58) Field of Classification Search ............ 455/323, 455/324, 325, 326, 333, 232.1–253.2, 334; 330/129, 254
See application file for complete search history.

(56) References Cited

U.S. PATENT DOCUMENTS

| | | | | |
|---|---|---|---|---|
| 4,704,738 A * | 11/1987 | Graziadei et al. | ...... | 455/252.1 |
| 5,384,501 A * | 1/1995 | Koyama et al. | ...... | 327/336 |
| 5,859,559 A * | 1/1999 | Hong et al. | ...... | 327/359 |
| 5,884,154 A * | 3/1999 | Sano et al. | ...... | 455/321 |
| 5,901,349 A * | 5/1999 | Guegnaud et al. | ...... | 455/302 |
| 5,933,771 A * | 8/1999 | Tiller et al. | ...... | 455/333 |
| 6,157,822 A * | 12/2000 | Bastani et al. | ...... | 455/323 |
| 6,229,395 B1 * | 5/2001 | Kay | ...... | 330/252 |
| 6,414,547 B1 * | 7/2002 | Shkap | ...... | 330/254 |
| 6,590,438 B1 * | 7/2003 | Manku et al. | ...... | 327/359 |
| 6,597,899 B2 * | 7/2003 | Souetinov et al. | ...... | 455/323 |
| 6,704,560 B1 * | 3/2004 | Balteanu et al. | ...... | 455/333 |
| 6,819,914 B2 * | 11/2004 | Yan et al. | ...... | 455/318 |
| 6,999,746 B2 * | 2/2006 | Wang | ...... | 455/323 |
| 7,088,981 B2 * | 8/2006 | Chang | ...... | 455/326 |
| 7,184,724 B1 * | 2/2007 | Ashby et al. | ...... | 455/130 |

* cited by examiner

*Primary Examiner*—Blane J Jackson
(74) *Attorney, Agent, or Firm*—Garlick Harrison & Markison; Timothy W. Markison

(57) ABSTRACT

A mixer includes a reference current source, a programmable gain RF transconductance section or an RF transconductance section, switching quad native transistors or switching quad transistors, and a folded-cascoded common mode output section or an output section. When the mixer included the programmable gain RF transconductance section, the gain of the mixer is adjustable. When the mixer includes the switching quad native transistors, flicker noise of the mixer is reduced. When the mixer includes the folded-cascoded common mode output section, the mixer operates reliably from low supply voltages.

20 Claims, 11 Drawing Sheets mixer 10 mixer 30 mixer 40 mixer 50 mixer 70 programmable gain RF
transconductance section 14 programmable gain RF
transconductance section 14 mixer 90 mixer 100 mixer 110

IF module 120

LOW NOISE AND LOW VOLTAGE MIXER AND INTERMEDIATE FREQUENCY MODULE APPLICATION THEREOF

This patent application is claiming priority under 35 USC § 120 as a continuing patent application of patent application entitled MIXER HAVING LOW NOISE, CONTROLLABLE GAIN, AND/OR LOW SUPPLY VOLTAGE OPERATION, having a filing date of Jan. 7, 2002, and a Ser. No. 10/041,148 now U.S. Pat. No. 6,865,382.

TECHNICAL FIELD OF THE INVENTION

This invention relates generally to radio frequency (RF) technologies and more particularly to mixers used within such RF technologies.

BACKGROUND OF THE INVENTION

Wireless communication systems are known to enable one wireless communication device to transmit data to at least one other wireless communication device via a wireless transmission medium. Such wireless communication systems may range from National or International cellular telephone systems to point-to-point in-home networking. For instance, a wireless communication system may be constructed, and hence operates, in accordance with one or more standards including, but not limited to, IEEE 802.11a, IEEE 802.11b, Bluetooth, advanced mobile phone services (AMPS), digital AMPS, global system for mobile communications (GSM), code division multiple access (CDMA), wireless application protocol (WAP), local multi-point distribution services (LMDS), multi-channel multi-point distribution systems (MMDS), and/or variations thereof.

As is also known, such wireless communication systems use radio frequencies for the wireless transmission medium. Thus, each wireless communication device that transmits data requires an RF transmitter and each wireless communication device that receives data requires an RF receiver. In general, an RF transmitter includes a modulator, local oscillator, one or mixers, power amplifier and an antenna. The inter-operation of these components is well known to modulate a data signal into an RF signal. Correspondingly, an RF receiver includes an antenna, which may be shared with the RF transmitter, a low noise amplifier, a local oscillator, one or more mixers, a summing module, filtering, and a demodulator to recapture the data signal from the RF signal.

Consequently, each wireless communication device includes a plurality of mixers within the RF transmitter and RF receiver to properly function within any type of wireless communication system. Not surprisingly, the quality of performance of a wireless communication device is dependent on the quality of performance (e.g., linearity) of the mixers included therein. A high quality mixer for certain applications is illustrated in FIG. 1 and is known as the Gilbert mixer. The Gilbert mixer, as shown, may be implemented using standard CMOS technology, however, for low supply voltage applications (e.g., less than 3.3 volts), it is difficult to obtain sufficient gain due to the output resistors R0 and R1.

To overcome this limitation, the Gilbert mixer can be modified as shown in FIG. 2. While this configuration improves the headroom capabilities of the mixer, it still has some limitations. For instance, such a mixer lacks built-in gain control, which would allow the gain of the mixer to be adjusted for various applications. In addition, the mixer, when used to directly translate RF signals into base-band signals, includes a significant amount of flicker noise, which is produced by switching transistors MG1-MG4. Further, the voltage excursion on switching transistors MG1-MG4 may be quite large, which causes device reliability issues of the switching transistors. Still further, the maximum swing of the mixer output, while maintaining acceptable distortion performance, could be quite limited for low supply voltage applications (e.g., less than 2 volts).

Therefore, a need exists for a mixer that reliably operates at low voltages (e.g., less than 2 volts), provides gain adjustments, reduces adverse affects of flicker-noise and/or limits voltage excursions of its switching transistors, which improves device reliability.

DETAILED DESCRIPTION OF A PREFERRED EMBODIMENT

Figures 1, 2:
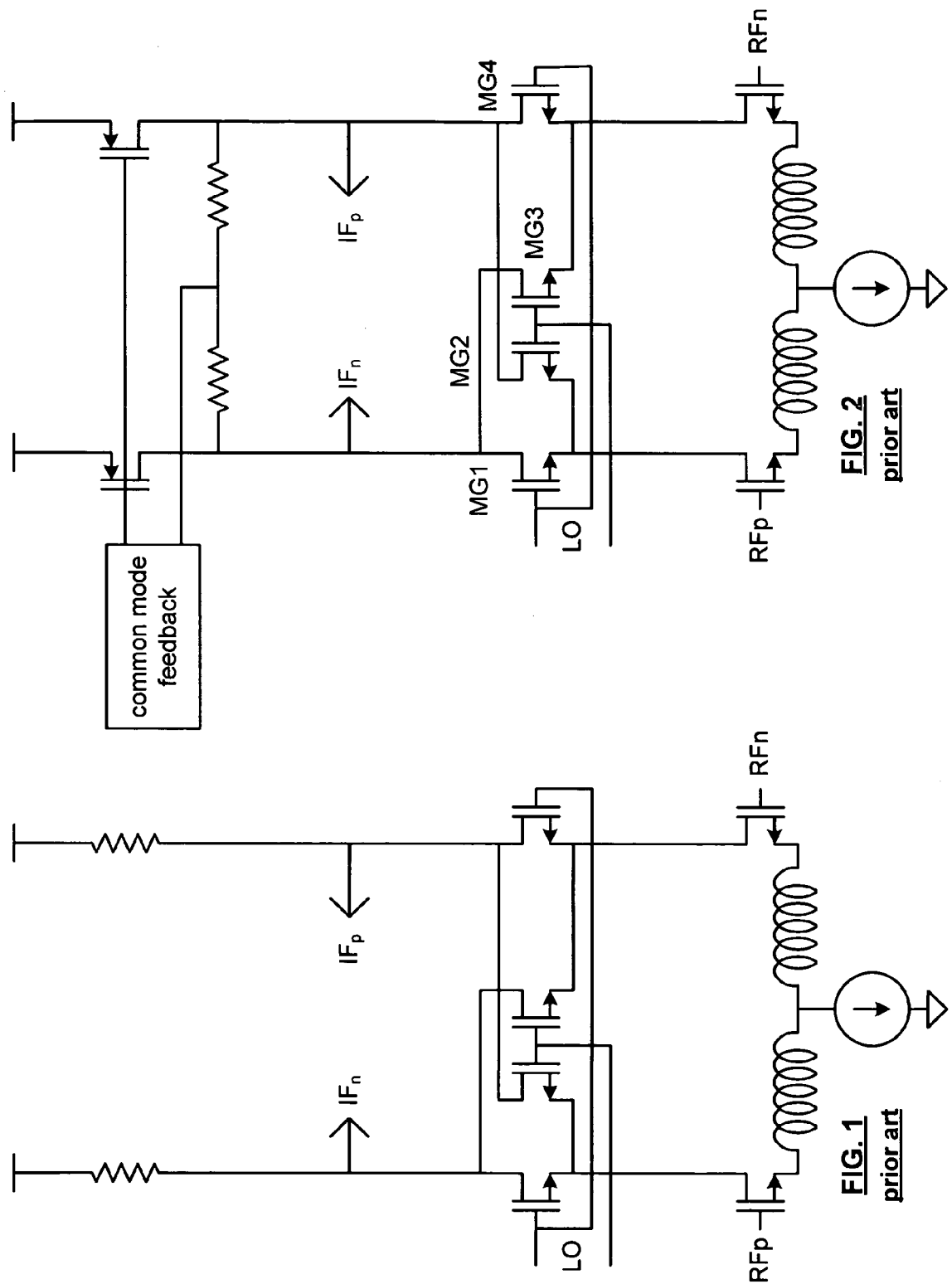
FIG. 1 illustrates a schematic block diagram of a prior art mixer.
FIG. 2 illustrates a schematic block diagram of an alternate prior art mixer.
Figure 3:
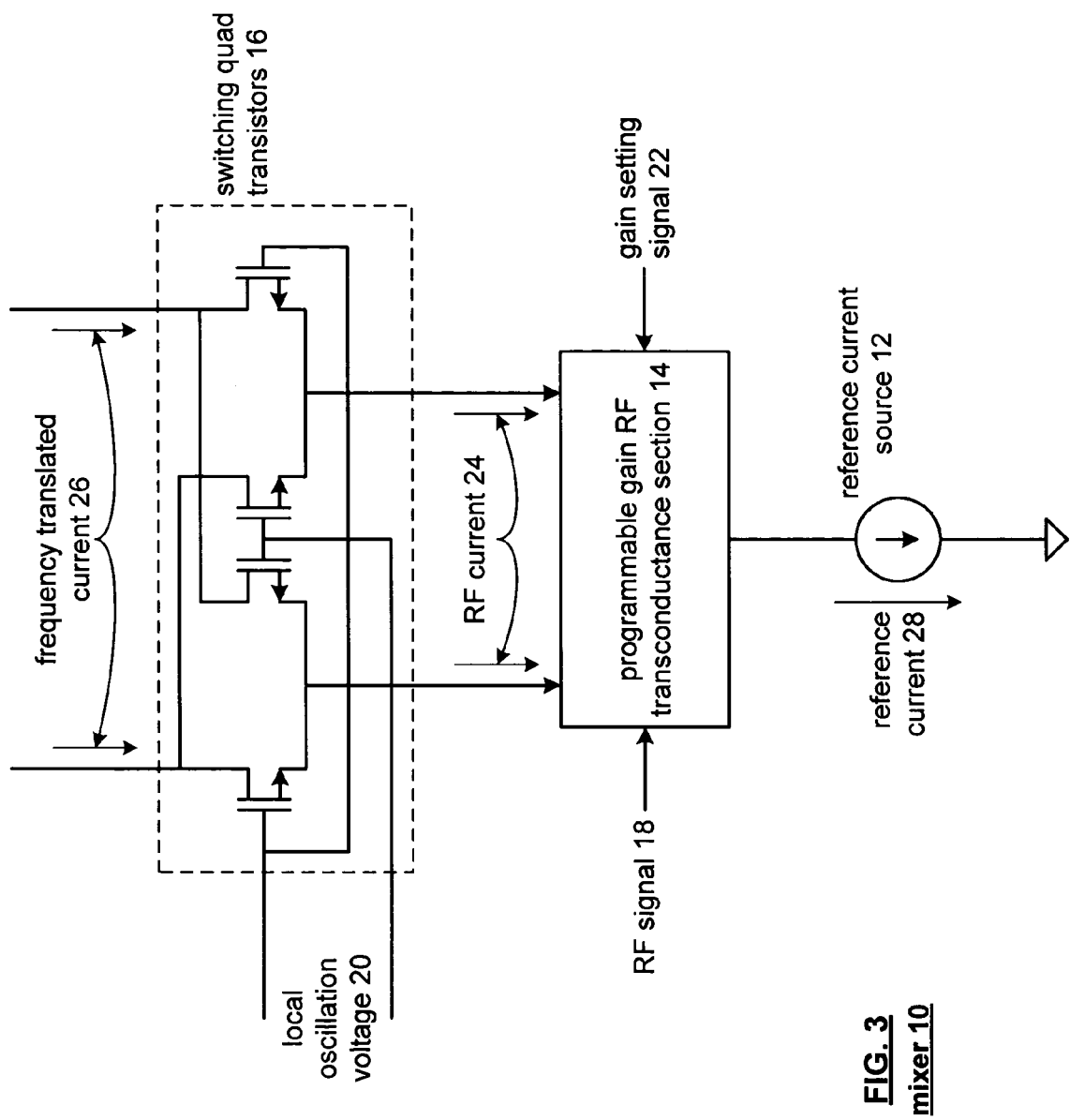
FIG. 3 illustrates a schematic block diagram of a mixer in accordance with the present invention.

FIG. 3 illustrates a schematic block diagram of a mixer 10 that includes a reference current source 12, a programmable gain RF transconductance section 14, and switching quad transistors 16. The reference current source 12 is operably coupled to provide a reference current 28 to the programmable gain RF transconductance section 14. The programmable gain RF transconductance section 14, which will be described in greater detail with reference to FIGS. 8 and 9, receives a RF signal 18 and a gain setting signal 22. Based on these inputs and the reference current 28, the programmable gain RF transconductance section 14 produces an RF current 24. Accordingly, the RF current 24 is representative of the RF signal 18 amplified in accordance with the gain setting signal 22.

The switching quad transistors 16 are operably coupled to generate a frequency translated current 26 from a local oscillation voltage 20 and the RF current 24. Accordingly, the frequency translated current 26 represents an up-conversion of the RF current 24 with respect to the local oscillation voltage 20 and a down-conversion of the RF current 24 with respect to the local oscillation voltage 20. For example, if the RF current 24 is represented by sin ($\omega_{RF}$t) and the local oscillation voltage 20 is represented by sin ($\omega_{LO}$t), the frequency translated current 26 would essentially equal ½ cos ($\omega_{RF}-\omega_L$)t-½ cos ($\omega_{RF}+\omega_L$)t. Accordingly, the cosine component including the differences between the frequency represents the down-conversion and the cosine portion including the summation of the frequencies represent the up-conversion.

The switching quad transistors 16 may be implemented utilizing native transistors or non-native transistors. Such non-native transistors have a gate-to-source voltage threshold that is greater than 0 volts and is typically in the range of 0.4 volts to 0.7 volts. A native transistor has a gate to source voltage threshold of approximately 0 volts. By utilizing the native transistors, which have a larger minimum channel length than non-native transistors, within the switching quad transistor 16, flicker-noise is reduced in comparison to using non-native transistors. In addition, by utilizing native devices within the switching quad transistors, the maximum voltage experienced by the gate body junction of the switching quad transistors is reduced by almost 1 voltage threshold. Accordingly, this helps the reliability of the switching devices.

Figure 4:
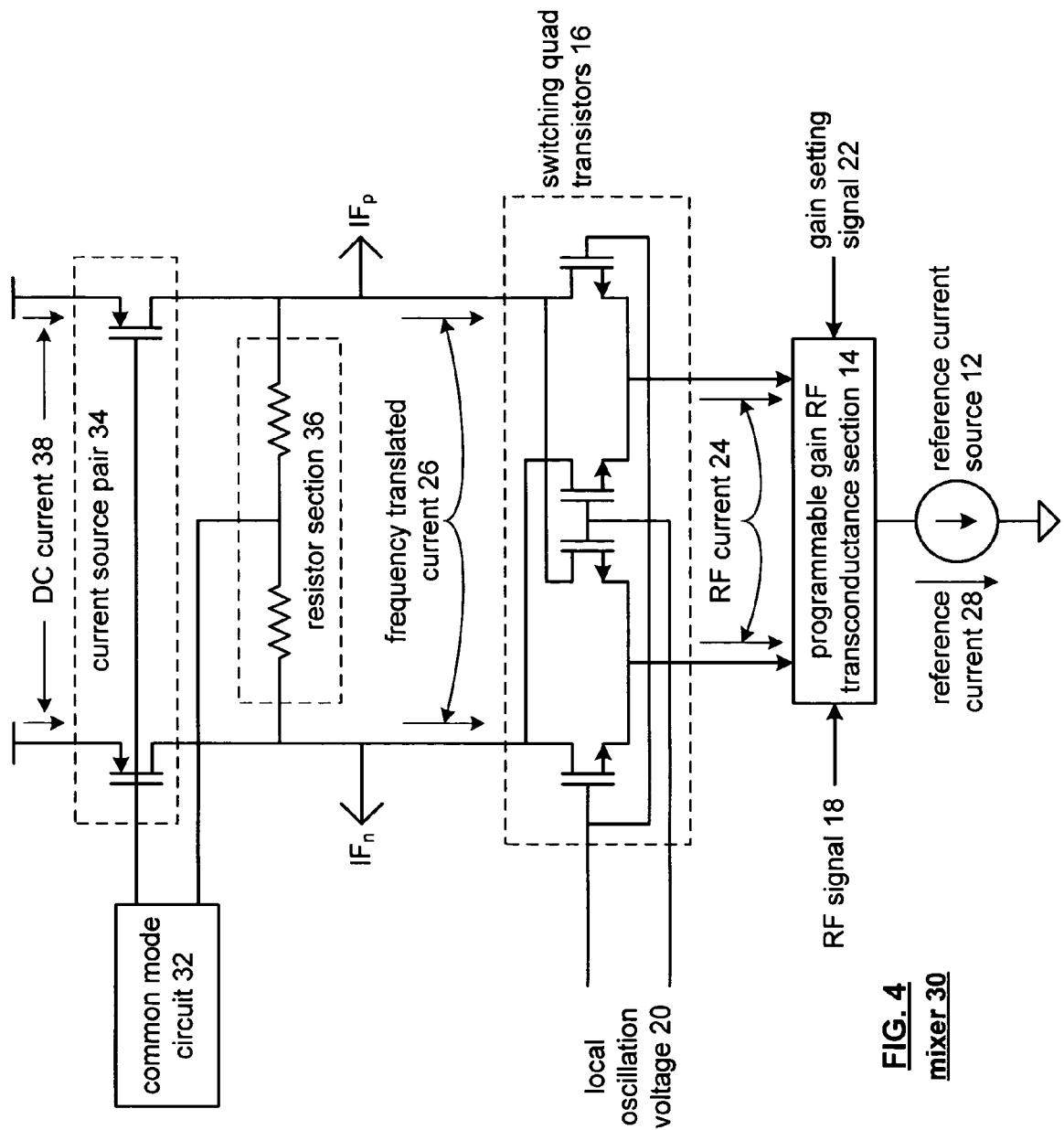
FIG. 4 illustrates a schematic block diagram of an alternate mixer in accordance with the present invention.

FIG. 4 illustrates a mixer 30 that includes the reference current source 12, the programmable gain RF transconductance section 14, the switching quad transistors 16, a resistor section 36, a current source pair 34, and a common mode circuit 32. In this configuration, the switching quad transistor 16, the programmable gain RF transconductance section 14, and the reference current source 12 operate as previously discussed with reference to FIG. 3.

The current source pair 34 is operably coupled to provide a DC current 38 to the switching quad transistors. The resistor section 36 is operably coupled to provide a current-to-voltage translation and to provide a common mode reference for common mode circuit 32. The common mode circuit 32 provides a gate voltage to the current source pair 34 to regulate the DC current 38 at a desired level.

In this implementation, mixer 30 provides a mixed voltage output of $IF_n$ and $IF_p$, which results from the current-to-voltage translation provided by the resistor section 36. Also, in this configuration, the mixer provides a low noise and gain controllable mixer that can operate at low voltage supplies (e.g., approximately 2 volts).

Figure 5:
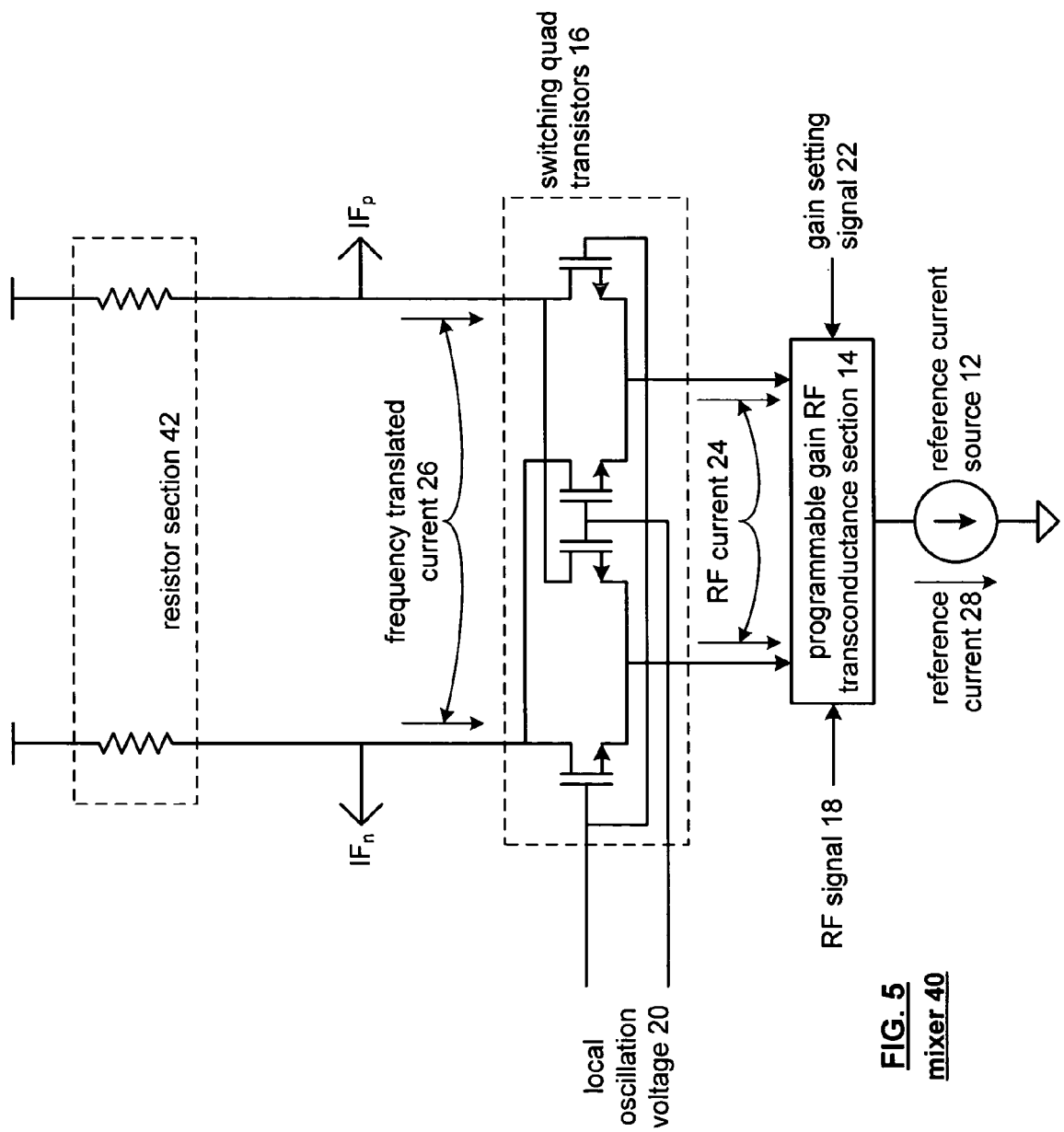
FIG. 5 illustrates a schematic block diagram of another mixer in accordance with the present invention.

FIG. 5 illustrates a schematic block diagram of a mixer 40 that includes the reference current source 12, the programmable gain RF transconductance section 14, the switching quad transistor 16 and a resistor section 42. In this configuration, the frequency translated current 26 is directly converted to a voltage via the resistor section 42.

As one of average skill in the art will appreciate, the mixer 40 of FIG. 5 provides controllable gain and low noise operation, especially when the switching quad transistors are implemented utilizing native transistors. However, in comparison with the mixer of FIG. 4, mixer 40 requires a slightly larger operating voltage.

Figure 6:
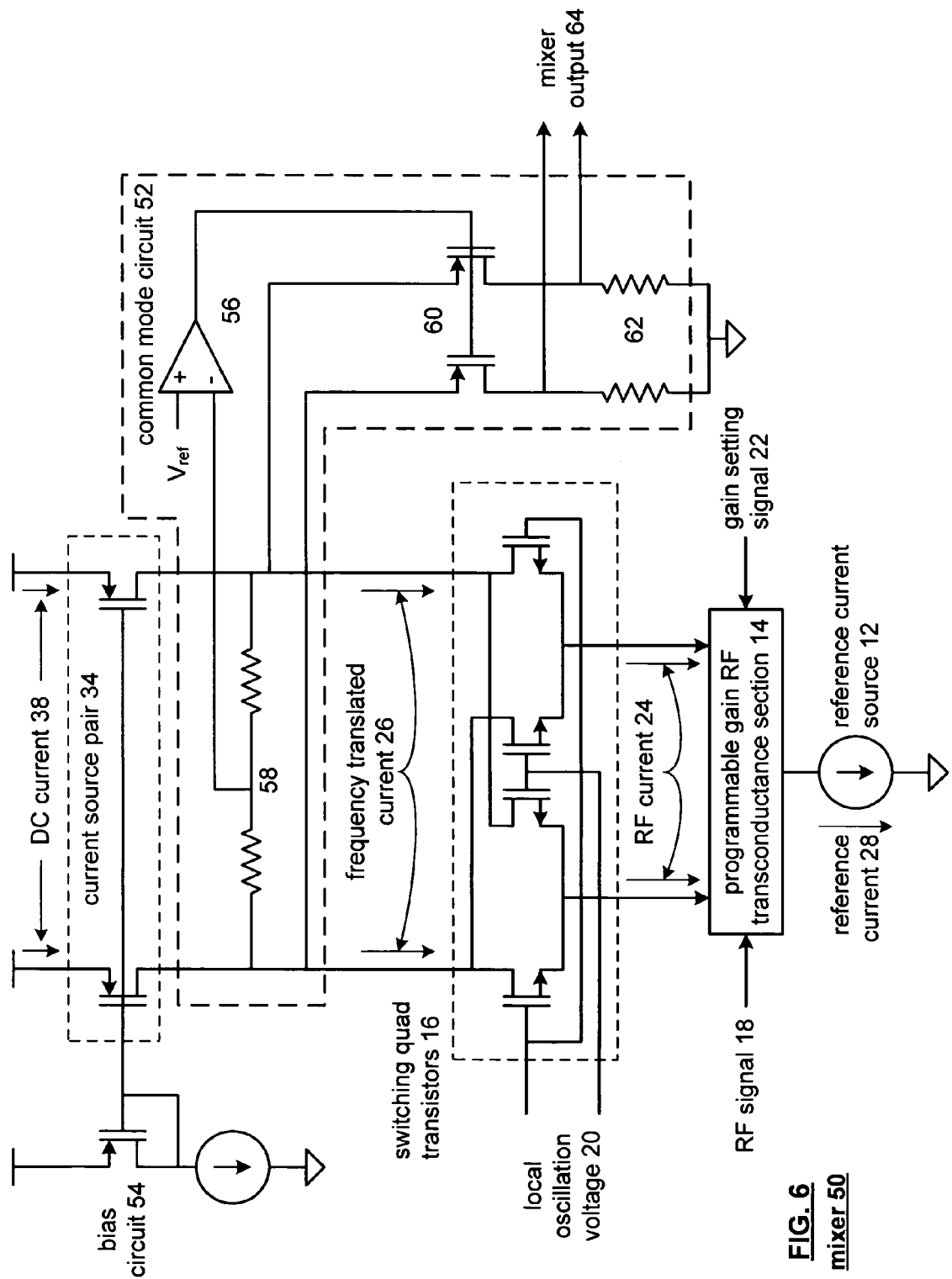
FIG. 6 illustrates a schematic block diagram of a further mixer in accordance with the present invention.

FIG. 6 illustrates a mixer 50 that includes reference current source 12, the programmable gain RF transconductance section 14, the switching quad transistors 16, current source pair 34, a common mode circuit 52, and a bias circuit 54. The bias circuit 54 is operably coupled to the current source pair 34 to provide gate voltage to the current source pair enabling it to produce the DC current 38.

The common mode circuit 52 includes a resistor divider 58, an operational amplifier 56, transistor pair 60, and resistor pair 62. The resistor divider 58 is operably coupled to the switching quad transistors 16. The tap of the resistor divider 58 provides a common mode reference to the operational amplifier 56. The other input of the operational amplifier is coupled to a reference voltage. Accordingly, the common mode circuit 52 will regulate the common mode of the frequency translated current 26 with respect to the reference voltage provided to the input of the operational amplifier 56. The operational amplifier 56 drives the transistor pair 60 to produce a current that is provided to the resistor pair 62. The interconnection between the transistor pair 60 and resistor pair 62 provides the mixer output 64.

As one of average skill in the art will appreciate, by utilizing the common mode circuit 52 in conjunction with the other components illustrated in FIG. 6, the supply voltage may be further decreased thus allowing mixer 50 to have a high quality of performance at very low supply voltages (e.g., approximately 1 volt to 1.8 volts). As one of average skill in the art will further appreciate, the common mode circuit 52 provides a folded cascoded output, which reduces voltage excursions of the transistor pair 60 thereby significantly improving supply voltage headroom at the mixer output 64. As one of average skill in the art will still further appreciate, the common mode voltage of the frequency translated current 26 is now an intermediate node within the mixer, hence the common mode of the frequency translated current 26 is controlled, which reduces voltage swings on the drain side of the transistor pair 60. This further improves lower voltage operation of the mixer. As one of average skill in the art will also appreciate, the programmable gain RF transconductance section 14 allows the mixer to have controllable gain while the switching quad transistor 16, especially when implemented with native transistors, reduces noise of the mixer.

Figure 7:
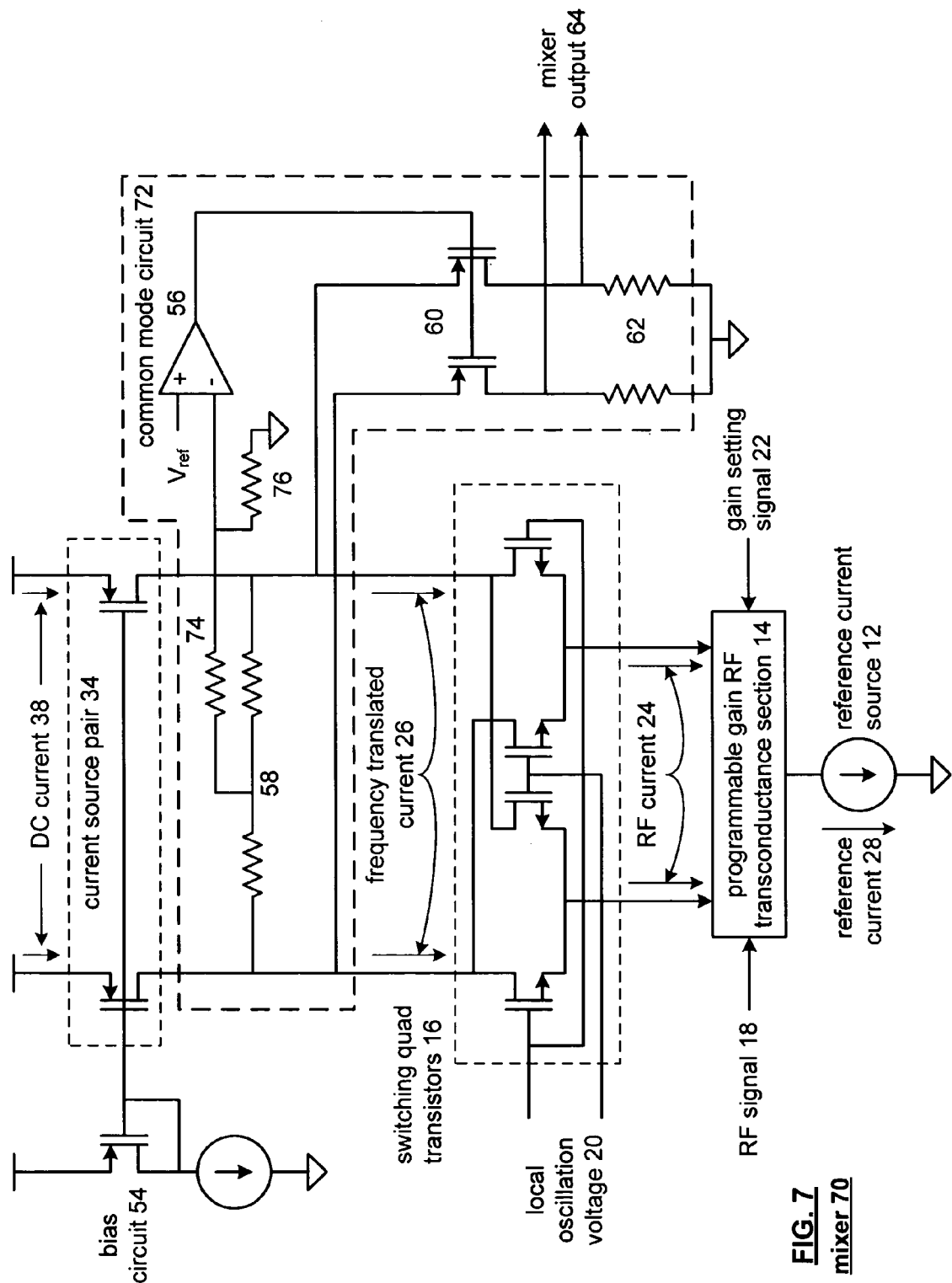
FIG. 7 illustrates a schematic block diagram of a still further mixer in accordance with the present invention.

FIG. 7 illustrates another mixer 70 that includes the reference current source 12, the programmable gain RF transconductance section 14, the switching quad transistor 16, the bias circuit 54, the current source pair 34, and a common mode circuit 72. The operation of the bias circuit 54, the current source pair 34, the switching quad transistor 16, the programmable gain RF transconductance section 14 and the reference current source 12 are as previously discussed.

The common mode circuit 72 includes the resistor divider 58, transistor pair 60 and resistor pair 62 of the common mode circuit 52 of FIG. 6. The common mode circuit 72 further includes a $2^{nd}$ resistor divider that includes resistors 74 and 76. The $2^{nd}$ resistor divider 74 and 76 allow the reference voltage into operational amplifier 56 to be reduced. By reducing the reference voltage, the operational amplifier 56 has its output range at approximately 7/10ths of a volt. This enables the operational amplifier to be implemented utilizing a single stage N-input or P-input operational amplifier and meet the constringent headroom constraints. Accordingly, the reference voltage may be set to approximately 900 milivolts.

Figure 8:
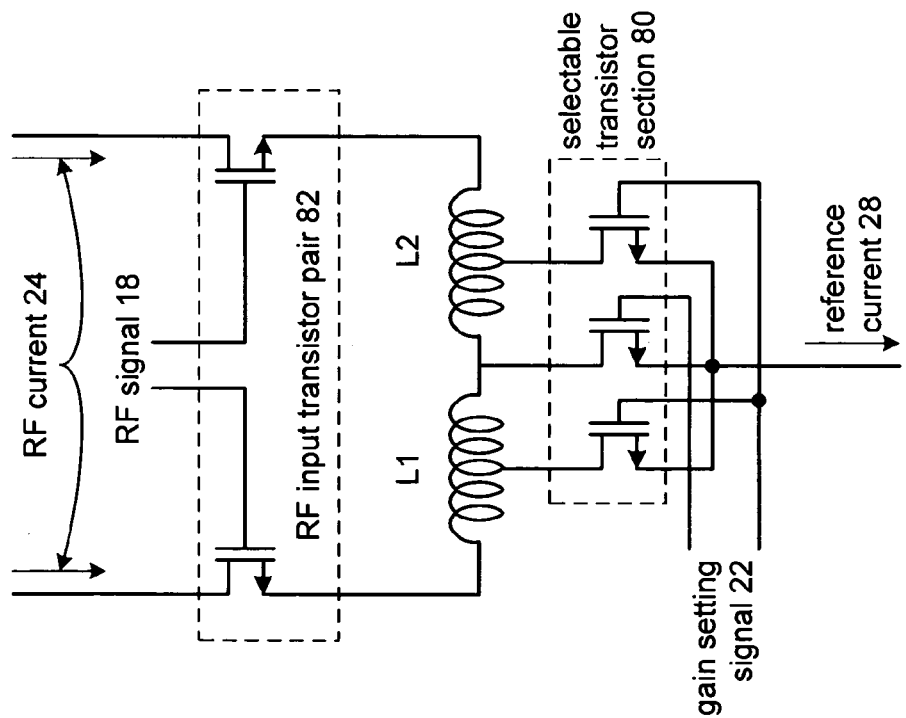
FIG. 8 illustrates a schematic block diagram of a programmable gain RF transconductance section that may be incorporated in one or more of the mixers of FIGS. 3 through 7.

FIG. 8 illustrates a schematic block diagram of an embodiment of the programmable gain RF transconductance section 14 that includes a RF input transistor pair 82, a $1^{st}$ inductor L1, a $2^{nd}$ inductor L2, and a selectable transistor section 80. As shown, the RF input transistor pair 82 includes a pair of N-channel transistors operably coupled to receive the RF signal 18. The inductors L1 and L2 each include a tap that is operably coupled to the selectable transistor section 80. The selectable transistor section 80 includes three N-channel transistors.

The gain setting signal 22 is coupled to the gates of the transistors of the selectable transistor section 80. When the gain setting signal 22 is in a low-gain state, the center transistor, which is coupled to the node coupling L1 and L2, is active while the other two transistors are inactive. As such, the reference current 28 is based on the transconductance produced via the RF input transistor pair 82 and the full inductance of inductors L1 and L2.

When the gain setting signal is in a high-gain state, the outside transistors of the selectable transistor section 80 are enabled. This couples the taps of inductors L1 and L2 to produce the reference current 28. As such, the gain of the transconductance section 14 is increased since the inductance provided by L1 and L2 is reduced in comparison the low-gain state operation.

Figure 9:
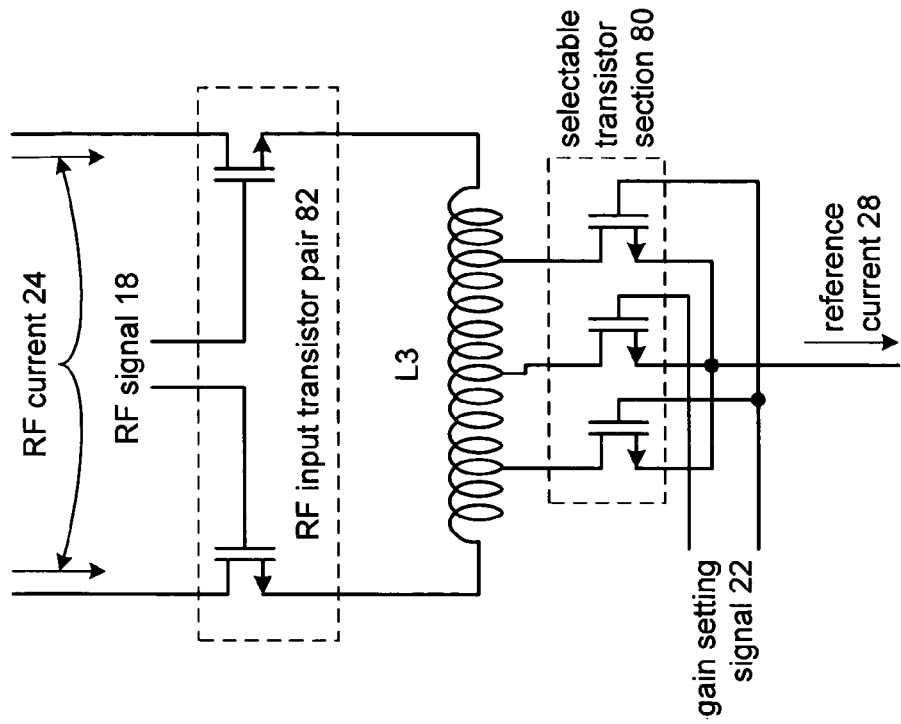
FIG. 9 illustrates a schematic block diagram of an alternate programmable gain RF transconductance section that may be incorporated in one or more of the mixers of FIGS. 3 through 7.

FIG. 9 illustrates a schematic block diagram of an alternate embodiment of the programmable gain RF transconductance section 14. The transconductance section 14 includes the RF input transistor pair 82, a differential tapped inductor L3 and the selectable transistor section 80. The functionality of the RF input transistor pair 82 and the selectable transistor section 80 are as previously discussed with reference to FIG. 8.

The differential tapped inductor L3 is a differential inductor that has each section tapped as illustrated. Accordingly, when the gain setting signal 22 is in a low-gain state, the center transistor of the selectable transistor section 80 is activated thus, employing the full inductance of both sections of the differential tapped inductor. When the gain setting signal 22 is in a high-gain state, the outside transistors of the selectable transistor section 80 are active thus, only a portion of the inductance of L3 is utilized.

As one of average skill in the art will appreciate, resistor dividers may be used within the transconductance section instead of the inductors to provide selectable gain, additional inductors may be used to provide further granularity of gain settings, or a combination thereof may be utilized. Regardless of the specific implementation used, the transconductance section 14 may be programmed to adjust the gain of the mixer for various mixing applications thus, enhancing the performance of such a mixer over a wide range of mixing applications.

Figure 10:
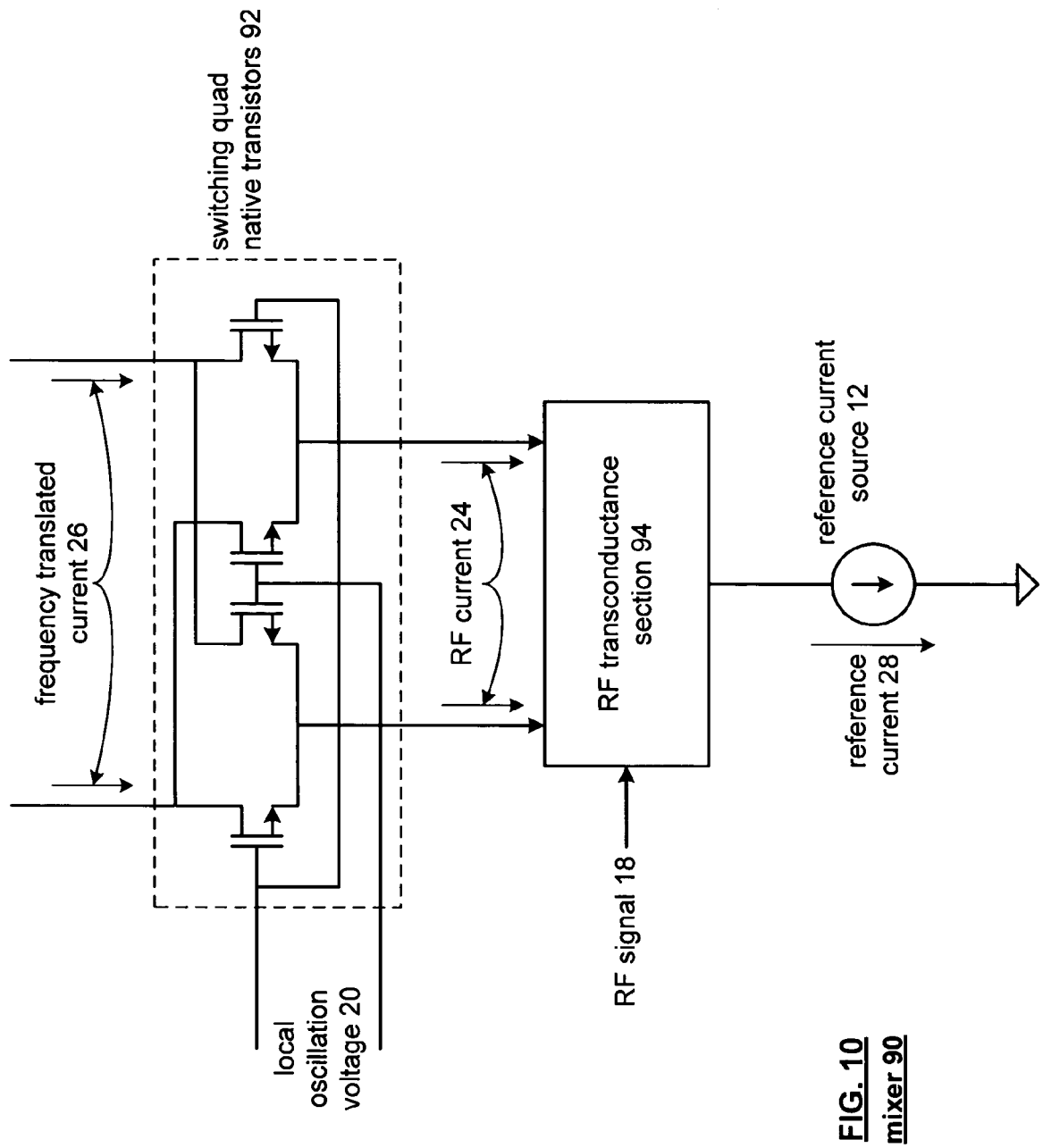
FIG. 10 illustrates a schematic block diagram of yet another mixer in accordance with the present invention.

FIG. 10 illustrates a schematic block diagram of mixer 90 that includes switching quad native transistors 92, a RF transconductance section 94, and a reference current source 12. As configured, the reference current source 12 produces a reference current 28 that is provided to the RF transconductance section 94. The RF transconductance section 94 generates a RF current 24 from a RF signal 18 based on the reference current 28.

The switching quad native transistors 92, which each include native transistors, convert the RF current 24 into a frequency translated current 26 based on a local oscillation voltage 20. The native transistors utilized within the switching quad native transistors 92 reduce the flicker-noise injected by the mixer thereby increasing the performance capabilities of such a mixer.

Figure 11:
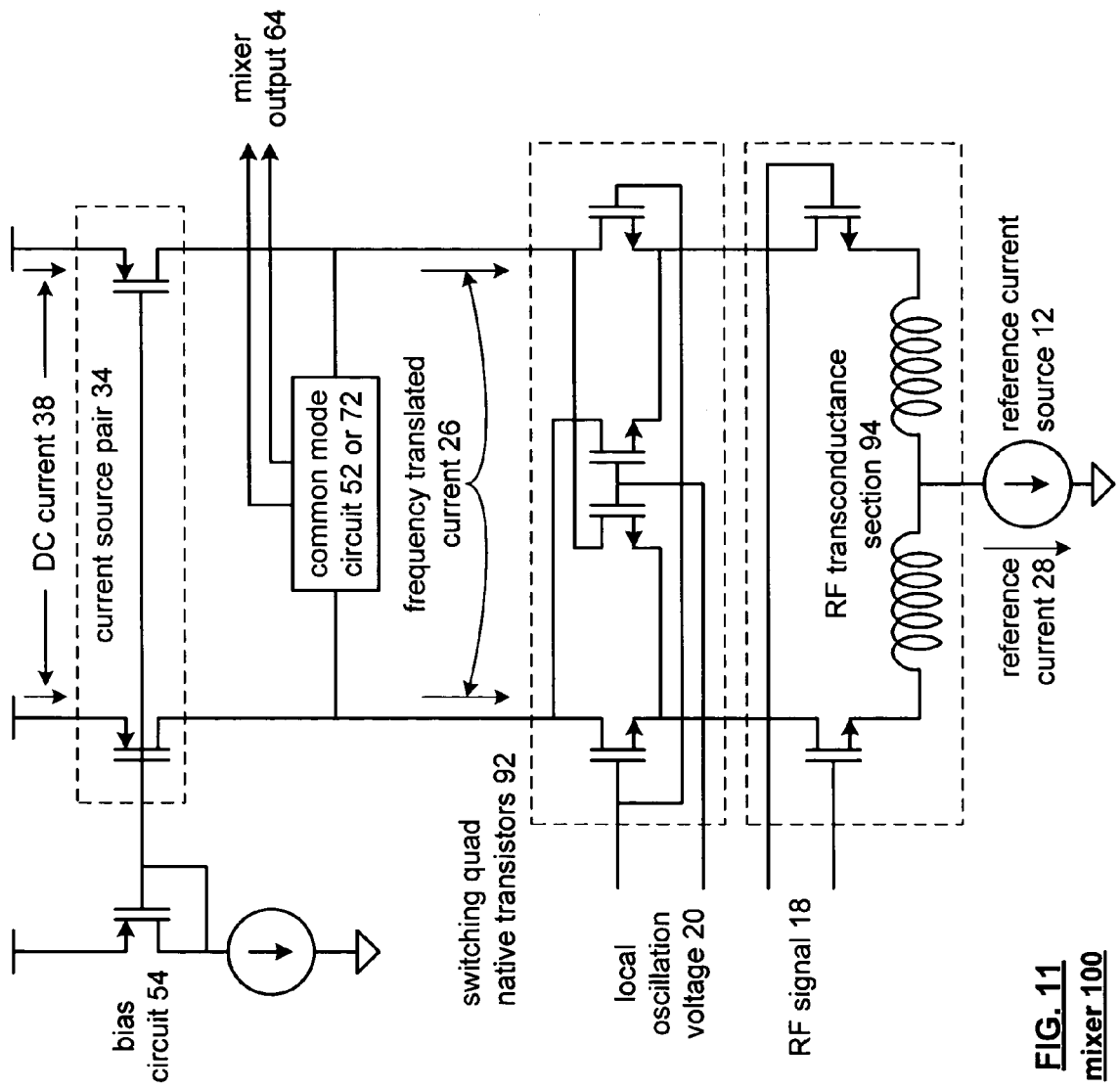
FIG. 11 illustrates a schematic block diagram of yet a further mixer in accordance with the present invention.

FIG. 11 illustrates a mixer 100 that includes the current source pair 34, common mode circuits 52 or 72, the switching quad native transistors 92, the RF transconductance section 94, and the reference current source 12. The RF transconductance section 94 includes a pair of transistors operably coupled to receive the RF signal 18 and a pair of inductors. The inductors improve the linearity of the RF transconductance section 94 but reduce the gain of the mixer. Alternatively, resistors may replace the inductors when headroom of the supply voltage is a less critical issue.

The overall function of mixer 100 is in accordance with the functioning of the mixers previously described. In particular, the RF transconductance section 94 converts an RF signal 18 into an RF current 26. The switching quad native transistors 92 convert the RF current into a frequency translated current 26 based on a local oscillation voltage 20. The common mode circuit 52 or 72 provides a common mode reference point to produce the mixer output 64. To facilitate the generation of the frequency translated current 26; the current source pair 34 provides a DC current 38. Alternatively, resistors may replace the current source pair 34 if headroom of the supply voltage is a less critical issue.

Figure 12:
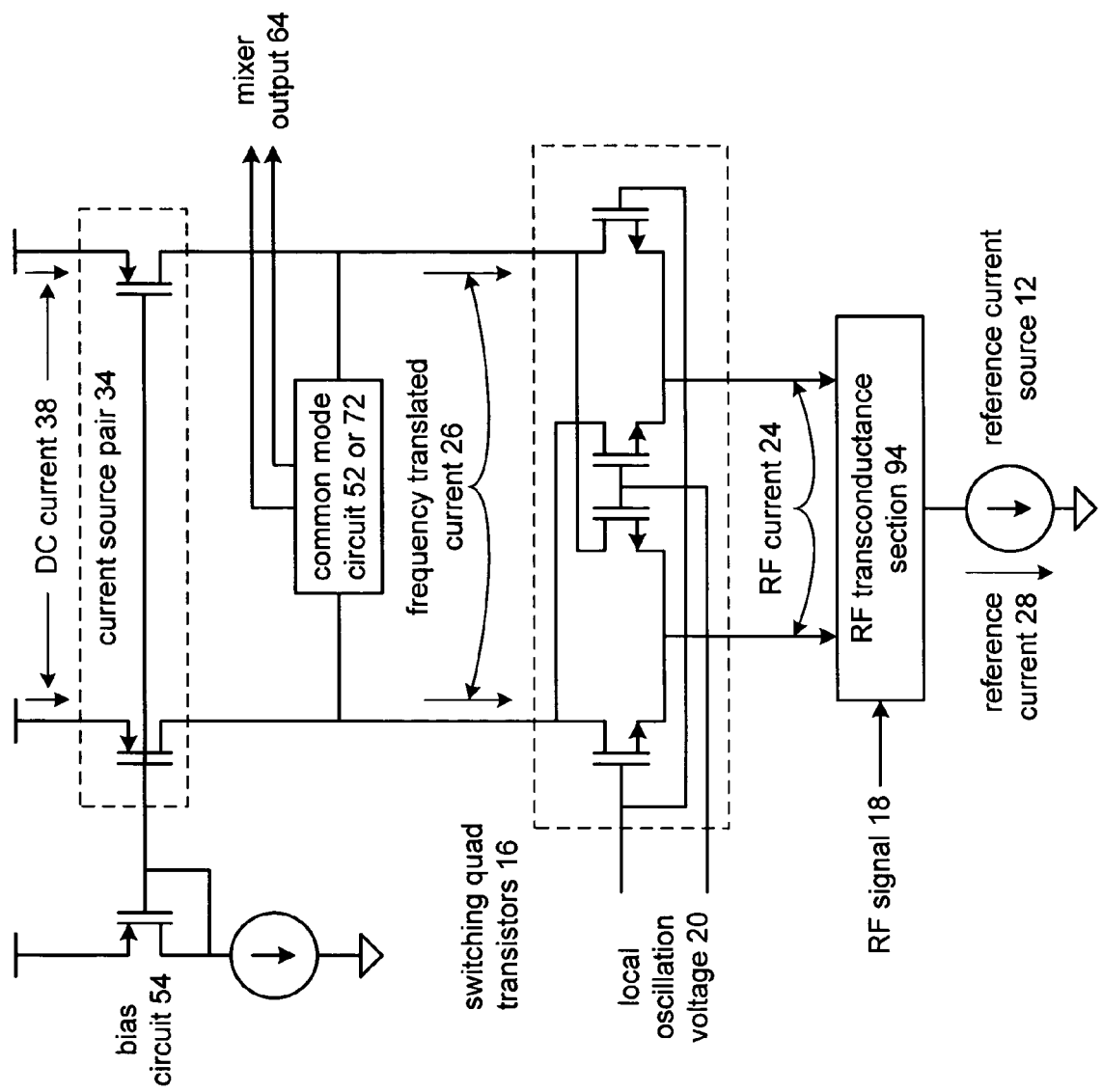
FIG. 12 illustrates yet another embodiment of a mixer in accordance with the present invention.

FIG. 12 illustrates a schematic block diagram of yet another mixer 110 that includes the reference current source 12, the RF transconductance section 94, switching quad transistor 16, common mode circuits 52 or 72 and current source pair 34. The functionality of mixer 110 is similar to the functionality of mixer 100 except that the switching quad native transistors 92 of mixer 100 have been replaced with non-native transistors within switching quad transistors 16.

Figure 13:
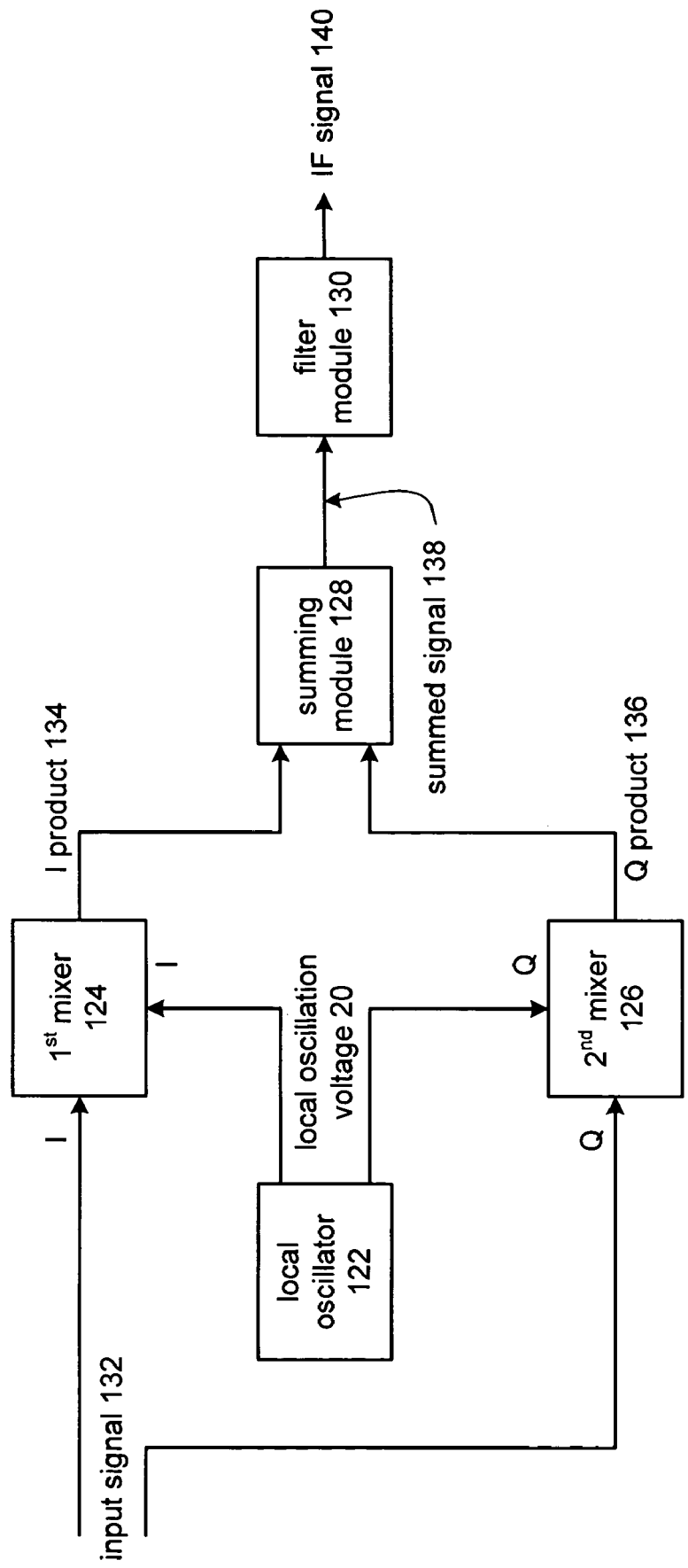
FIG. 13 illustrates a schematic block diagram of an intermediate frequency module in accordance with the present invention.

FIG. 13 illustrates a schematic block diagram of an intermediate frequency module 120 that includes a $1^{st}$ mixer 124, a $2^{nd}$ mixer 126, a local oscillator 122, a summing module 128 and a filter module 130. The IF module 120 may be used in a radio frequency receiver and/or in a radio frequency transmitter.

In operation, the $1^{st}$ mixer 24 receives an in-phase component of an input signal 32 (e.g., an RF signal for a receive and an IF signal for a transmitter) and an in-phase component of local oscillation voltage 20. The $1^{st}$ mixer 124, which may be any of the mixers illustrated in FIGS. 3-12, mixes the in-phase input signal and in-phase local oscillation to produce an I product 134. Similarly, the $2^{nd}$ mixer 126 mixes a quadrature portion of the input signal 132 with a quadrature component of the local oscillation voltage 20 to produce a quadrature product 136. Each of the I and Q products 134 and 136 will include an up-conversion of the input signal based on the local oscillation voltage 20 and a down-conversion of the input signal based on the local oscillation voltage 20.

The summing module 128 sums the I product 134 and the Q product 136 to produce a summed signal 138. The filtering module 130 filters either the up-converted portion of the summed signal 138 or the down-conversion portion of the summed signal 138 to produce an IF signal 140. The filtering module 130 will filter the down-conversion portion of the summed signal 138 such that the up-conversion portion is left when the IF module 120 is incorporated in a radio transmitter. Conversely, the filtering module 130 will filter the up-conversion portion of the summed signal 138 and thus pass the down-conversion portion of the summed signal 138 when the IF module 120 is incorporated in a radio receiver.

The preceding discussion has presented a mixer that provides programmable gain, reduces flicker-noise, and/or operates from small supply voltages. By employing the programmable gain RF transconductance section, a mixer includes programmable gain; by utilizing native transistors within the switching quad transistors, flicker-noise is reduced; and by utilizing a folded-cascoded common mode circuit, voltage operations may be reduced. As one of average skill in the art will appreciate, other embodiments may be derived from the teachings of the present invention without deviating from the scope of the claims.

What is claimed is:

1. A mixer comprises:
   reference current source operably coupled to produce a reference current;
   programmable gain radio frequency (RF) transconductance section operably coupled to convert an RF voltage into an RF current based on a gain setting signal and the reference current; and
   switching quad transistors operably coupled to receive the RF current and a local oscillator voltage, wherein the switching quad transistors produce a frequency translated current;
   current source pair operably coupled to provide DC current to the switching quad transistors; and common mode circuit operably coupled to provide a common mode voltage to the current source pair based on a common mode reference.

2. The mixer of claim 1 further comprises:
resistor section operably coupled to switching quad transistors and to the current source pair to produce the common mode reference and to convert the frequency translated current into a frequency translated voltage.

3. The mixer of claim 1
wherein the common mode circuit includes:
resistive divider operably coupled to the switching quad transistors, wherein a tap of the resistive divider provides the common mode reference;
operational amplifier having inputs operably coupled to a reference voltage and to receive the common mode reference;
transistor pair operably driven by an output of the operational amplifier; and
resistor pair operably coupled to the transistor pair to provide an output of the mixer.

4. The mixer of claim 1
wherein the common mode circuit includes:
resistive divider operably coupled to the switching quad transistors, wherein a tap of the resistive divider provides the common mode reference;
second resistive divider operably coupled to the tap of the resistive divider to provide a scaled representation of the common mode reference;
operational amplifier having inputs operably coupled to a reference voltage and to receive the scaled representation of the common mode reference;
transistor pair operably driven by an output of the operational amplifier; and resistor pair operably coupled to the transistor pair to provide an output of the mixer.

5. The mixer of claim 1 further comprises:
resistor section operably coupled to convert the frequency translated current into a frequency translated voltage.

6. A mixer comprises:
reference current source operably coupled to produce a reference current;
programmable gain radio frequency (RB transconductance section operably coupled to convert an RF voltage into an RF current based on a gain setting signal and the reference current, wherein the programmable gain RF transconductance section further comprises:
RF input transistor pair operably coupled to receive the RF signal;
first tapped inductor operably coupled to the RF input transistor pair;
second tapped inductor operably coupled to the RF input transistor pair; and
selectable transistor section operably coupled to the first and second tapped inductors and to the reference current source, wherein, based a first state of the gain setting signal, the selectable transistor section couples the first and second tapped inductors to the reference current source to provide a first gain, and wherein, based on a second state of the gain setting signal, the selectable transistor section couples the first and second tapped inductors to the reference current source to provide a second gain; and
switching quad transistors operably coupled to receive the RF current and a local oscillator voltage, wherein the switching quad transistors produce a frequency translated current.

7. A mixer comprises:
reference current source operably coupled to produce a reference current; programmable gain radio frequency (RF) transconductance section operably coupled to convert an RF voltage into an RF current based on a gain setting signal and the reference current, wherein the programmable gain RF transconductance section further comprises:
RF input transistor pair operably coupled to receive the RF signal;
differential tapped inductor operably coupled to the RF input transistor pair; and
selectable transistor section operably coupled to the differential tapped inductor and to the reference current source, wherein, based a first state of the gain setting signal, the selectable transistor section couples the differential tapped inductor to the reference current source to provide a first gain, and wherein, based on a second state of the gain setting signal, the selectable transistor section couples the differential tapped inductors to the reference current source to provide a second gain; and
switching quad transistors operably coupled to receive the RF current and a local oscillator voltage, wherein the switching quad transistors produce a frequency translated current.

8. A mixer comprises:
reference current source operably coupled to produce a reference current
programmable gain radio frequency (RF) transconductance section operably coupled to convert an RF voltage into an RF current based on a gain setting signal and the reference current and
switching quad transistors operably coupled to receive the RF current and a local oscillator voltage, wherein the switching quad transistors produce a frequency translated current,
wherein the switching quad transistors further comprises:
native transistors operably coupled to produce the frequency translated current such that flicker noise of the mixer is reduced and gate to body voltage of the switching quad transistors is reduced.

9. An intermediate frequency (IF) module comprises:
local oscillator operably coupled to provide a local oscillation voltage;
first mixer operably coupled to mix an in-phase component of a signal with an in-phase component of the local oscillation voltage to produce an in-phase product;
second mixer operably coupled to mix a quadrature component of the signal with a quadrature component of the local oscillation voltage to produce a quadrature product, wherein each of the first and second mixers includes:
reference current source operably coupled to produce a reference current;
programmable gain radio frequency (RF) transconductance section operably coupled to convert voltage of the signal into current of the signal based on a gain setting signal and the reference current; and
switching quad transistors operably coupled to receive the current of the signal and the local oscillator voltage, wherein the switching quad transistors translate frequency of the current of the signal to produce the in-phase product and the quadrature product, respectively;
current source pair operably coupled to provide DC current to the switching quad transistors; and common mode circuit operably coupled to provide a common mode voltage to the current source pair based on a common mode reference; and summing module operably coupled to sum the in-phase product and the quadrature product to produce a summed signal; and filter module operably coupled to filter the summed signal to produce an IF signal.

10. The IF module of claim 9, wherein each of the first and second mixers further comprises:

resistor section operably coupled to switching quad transistors and to the current source pair to produce the common mode reference and to convert the frequency translated current into a frequency translated voltage.

11. The IF module of claim 9, wherein each of the first and second mixers further comprises:

resistor section operably coupled to convert the frequency translated current into a frequency translated voltage.

12. The IF module of claim 9, wherein the programmable gain RF transconductance section further comprises:

RF input transistor pair operably coupled to receive the RF signal;

first tapped inductor operably coupled to the RF input transistor pair;

second tapped inductor operably coupled to the RF input transistor pair; and selectable transistor section operably coupled to the first and second tapped inductors and to the reference current source, wherein, based a first state of the gain setting signal, the selectable transistor section couples the first and second tapped inductors to the reference current source to provide a first gain, and wherein, based on a second state of the gain setting signal, the selectable transistor section couples the first and second tapped inductors to the reference current source to provide a second gain.

13. The IF module of claim 9, wherein the programmable gain RF transconductance section further comprises:

RF input transistor pair operably coupled to receive the RF signal;

differential tapped inductor operably coupled to the RF input transistor pair; and selectable transistor section operably coupled to the differential tapped inductor and to the reference current source, wherein, based a first state of the gain setting signal, the selectable transistor section couples the differential tapped inductor to the reference current source to provide a first gain, and wherein, based on a second state of the gain setting signal, the selectable transistor section couples the differential tapped inductors to the reference current source to provide a second gain.

14. The IF module of claim 9, wherein the switching quad transistors further comprises:

native transistors operably coupled to produce the frequency translated current such that flicker noise of the mixer is reduced and gate to body voltage of the switching quad transistors is reduced.

15. A mixer comprises:

reference current source operably coupled to produce a reference current;

programmable gain radio frequency (RF) transconductance section operably coupled to convert an RF voltage into an RF current based on a gain setting signal and the reference current;

switching quad transistors operably coupled to receive the RF current and a local oscillator voltage, wherein the switching quad transistors produce a frequency translated current;

current source pair operably coupled to provide DC current to the switching quad transistors; and common mode circuit operably coupled to provide a common mode voltage to the current source pair based on a common mode reference.

16. The mixer of claim 15, further comprising:

resistor section operably coupled to switching quad transistors and to the current source pair to produce the common mode reference and to convert the frequency translated current into a frequency translated voltage.

17. The mixer of claim 15, wherein the current mode circuit comprises:

resistive divider operably coupled to the switching quad transistors, wherein a tap of the resistive divider provides the common mode reference;

operational amplifier having inputs operably coupled to a reference voltage and to receive the common mode reference;

transistor pair operably driven by an output of the operational amplifier; and resistor pair operably coupled to the transistor pair to provide an output of the mixer.

18. The mixer of claim 15, wherein the programmable gain RF transconductance section further comprises:

RF input transistor pair operably coupled to receive the RF signal;

first tapped inductor operably coupled to the RF input transistor pair;

second tapped inductor operably coupled to the RF input transistor pair; and selectable transistor section operably coupled to the first and second tapped inductors and to the reference current source, wherein, based a first state of the gain setting signal, the selectable transistor section couples the first and second tapped inductors to the reference current source to provide a first gain, and wherein, based on a second state of the gain setting signal, the selectable transistor section couples the first and second tapped inductors to the reference current source to provide a second gain.

19. The mixer of claim 15, wherein the programmable gain RF transconductance section further comprises:

RF input transistor pair operably coupled to receive the RF signal;

differential tapped inductor operably coupled to the RF input transistor pair; and selectable transistor section operably coupled to the differential tapped inductor and to the reference current source, wherein, based a first state of the gain setting signal, the selectable transistor section couples the differential tapped inductor to the reference current source to provide a first gain, and wherein, based on a second state of the gain setting signal, the selectable transistor section couples the differential tapped inductors to the reference current source to provide a second gain.

20. The mixer of claim 15, wherein the switching quad transistors further comprises:

native transistors operably coupled to produce the frequency translated current such that flicker noise of the mixer is reduced and gate to body voltage of the switching quad transistors is reduced.

* * * * *

UNITED STATES PATENT AND TRADEMARK OFFICE
CERTIFICATE OF CORRECTION

PATENT NO. : 7,477,888 B2 Page 1 of 1
APPLICATION NO. : 11/021631
DATED : January 13, 2009
INVENTOR(S) : Arya Reza Behzad It is certified that error appears in the above-identified patent and that said Letters Patent is hereby corrected as shown below:

Column 7, line 43, in Claim 6: replace "(RB" with --(RF)--.

Column 8, line 29, in Claim 8: replace "current" with --current;--.

Signed and Sealed this

Twenty-third Day of June, 2009

JOHN DOLL
*Acting Director of the United States Patent and Trademark Office*